(12) United States Patent
Confalonieri et al.

(10) Patent No.: US 8,692,612 B2
(45) Date of Patent: Apr. 8, 2014

(54) ELECTRONIC DEVICE FOR REGULATING A VARIABLE CAPACITANCE OF AN INTEGRATED CIRCUIT

(75) Inventors: Pierangelo Confalonieri, Caponago (IT); Federico Guanziroli, Lentate sul Seveso (IT); Germano Nicollini, Piacenza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 484 days.

(21) Appl. No.: 12/891,409

(22) Filed: Sep. 27, 2010

(65) Prior Publication Data

US 2011/0074221 A1    Mar. 31, 2011

(30) Foreign Application Priority Data

Sep. 29, 2009   (IT) ............... MI09A001664

(51) Int. Cl.
*H03B 1/00* (2006.01)
*H03K 5/00* (2006.01)
*H04B 1/10* (2006.01)

(52) U.S. Cl.
USPC ........................................... 327/554

(58) Field of Classification Search
USPC .......... 341/172, 150; 327/336, 337, 334, 343, 327/344, 345, 554, 365
See application file for complete search history.

(56) References Cited

U.S. PATENT DOCUMENTS

| | | | |
|---|---|---|---|
| 4,129,863 A * | 12/1978 | Gray et al. ............. | 341/172 |
| 6,327,463 B1 | 12/2001 | Welland | |
| 6,882,298 B2 * | 4/2005 | Leung et al. ........... | 341/172 |
| 7,280,001 B2 * | 10/2007 | Maligeorgos et al. ...... | 331/158 |
| 7,646,236 B2 * | 1/2010 | Cicalini ................. | 327/553 |
| 7,834,796 B2 * | 11/2010 | Xu et al. ............... | 341/172 |
| 7,924,209 B2 * | 4/2011 | Kuo et al. .............. | 341/172 |
| 2003/0206070 A1 | 11/2003 | Pietruszynski et al. | |
| 2007/0057739 A1 * | 3/2007 | Maligeorgos et al. ..... | 331/36 C |
| 2007/0236281 A1 | 10/2007 | Cicalini | |
| 2010/0090757 A1 * | 4/2010 | Finocchiaro ........... | 327/554 |
| 2010/0090873 A1 * | 4/2010 | Yang .................... | 341/118 |

FOREIGN PATENT DOCUMENTS

EP          1816743 A1    8/2007

* cited by examiner

*Primary Examiner* — Rexford Barnie
*Assistant Examiner* — Rasem Mourad
(74) *Attorney, Agent, or Firm* — Seed IP Law Group PLLC

(57) ABSTRACT

The present disclosure relates to an electronic regulation device of a variable capacitance of an integrated circuit having a time parameter depending on the variable capacitance. The regulation device includes a regulation loop, and is configured to generate in output a plurality of binary regulation signals.

21 Claims, 2 Drawing Sheets

ELECTRONIC DEVICE FOR REGULATING A VARIABLE CAPACITANCE OF AN INTEGRATED CIRCUIT

BACKGROUND

1. Technical Field

The present disclosure relates to the technical field of electronic integrated circuits with adjustable capacitances. Particularly, the present disclosure relates to a regulation device of a variable capacitance in an integrated circuit having a time parameter depending on such capacitance.

2. Description of the Related Art

As it is known, in the field of the electronic circuits integrated on a chip of semiconductor material, a capacitance value of an integrated capacitor, such as the value of an integrated resistor, strongly depends on the manufacturing process. Particularly, in the integrated circuits having filters, the cut-off frequency of which is determined by a RC product, or ramp generators, in which the ramp slope itself depends on the C/I ratio, the spreads of the values of the resistor-capacitance product and the capacitance-current ratio, caused by the manufacturing process, compared to prefixed values, are significant and reach ±50%.

In order to limit such effects, for example, in the case of integrated filters, it is provided to implement a modular structure of capacitors in which the capacitance C is variable in order to regulate the RC product. Such modular structure, shown by way of example in FIG. 2 with the reference 200 in the case of a 4-bit regulation, includes a reference capacitor $C_F$ that can be connected in parallel to a plurality of capacitors C1, C2, C3, C4, or modular capacitive elements, which are binarily weighed (1C, 2C, 4C, 8C) starting from a minimum unit capacitance 1C. Particularly, each capacitor C1, C2, C3, C4 of the plurality is selectively connectable in parallel to the reference capacitor $C_F$ or disconnectable therefrom after the activation/deactivation of corresponding switches S1-S4 that are controlled by binary logic signals (0 and logic 1) B0, B1, B2, B3.

Generally, such control logic signals B0, B1, B2, and B3 are generated by a feedback regulation device associated with the integrated filter of the type known by a person skilled in the art. Particularly, such regulation device includes a block of capacitors that is substantially analogous (except for scale differences) to those of the modular structure 200 of FIG. 2.

As it is known, the above-mentioned fedback regulation device operates by trial and error, for example, by successive approximations, until determining an overall capacitance value of the capacitor block such as to make the filter RC product value proximate to that predetermined by the design specifications with residual error compatible to the preset accuracy percentage. In other words, if the RC product of the integrated filter is a maximum following the process spreads, to obtain the desired value a minimum capacitance C value is used, usually the reference capacitor $C_F$ value (the other capacitors will be excluded from parallelisms with the latter one). Vice versa, if the RC product is a minimum after the process, it is necessary to increase, by successive approximations, the reference capacitance $C_F$ value, by selectively placing it in parallel to the latter some or all the capacitors C1, C2, C3, C4.

At the end of the regulation step, the regulated capacitance C value is associated with a regulation sequence formed by the binary logic signals B0, B1, B2, and B3. Such regulation sequence, sent on a bus to the integrated filter, represents the sequence of control signals for the modular structure 200 capacitors C1, C2, C3, and C4.

Such known technique of regulating a capacitive value is not free from drawbacks.

In fact, during each step of the regulation operation, upon variation of the logic values assumed by the signals B0, B1, B2, B3, the number and the capacitance value of the capacitors C1, C2, C3, C4 that are selectively placed in parallel to the reference capacitor $C_F$, change until reaching the capacitance value that is useful for the self-regulation. Therefore, the total capacitance of the capacitor block varies in percentage in a different manner according to the number of capacitors placed in parallel therebetween in a given instant. For example, if the capacitor C1 is added to the reference capacitor CF, the capacitance percentage variation determined by the addition of C1 will be $C1/(C_F+C1)$. If, on the contrary, the capacitor C1 is added when the other capacitors C2, C3, and C4 are already enabled, the percentage increase provided by C1 will be equal to $C1/(C_F+C1+C2+C3+C4)$.

Consequently, if the RC product is lower than a value that has been preset during the design step, following the manufacturing process, the capacitance percentage variation that is achieved with a minimum unit capacitance (i.e., varying a regulation bit), is different from the variation that could be obtained by adding such minimum capacitance for RC values higher than the preset value. Particularly, if the RC is lower than the preset value (therefore a number of capacitors have to be connected in parallel therebetween at the moment of the last bit assessment), then the percentage variation of the regulated capacitance achieved by adding a single unit capacitor is lower than the one that would be obtained if the RC would have been higher than the preset value.

It shall be noticed that the regulation devices of the known type are generally arranged to ensure the required accuracy (for example, 5%) in the worst case, i.e., in the case in which the RC product, at the end of the process, is higher than the value that has been predetermined in the design step. However, the Applicant noticed that, if, on the contrary, the RC product is lower than the preset value after the process, the accuracy ensured by such known regulation devices is much higher than that required (for example, 2%).

This demonstrates the inefficiency of the known regulation solution, since, in order to ensure the required accuracy, in the worst case the trend is to increase the regulation bits, i.e., to increase the number of the capacitances involved and, consequently, increase the cost in terms of area that is occupied by the integrated circuits.

BRIEF SUMMARY

The present disclosure provides an electronic device for regulating a variable capacitance of an integrated circuit that at least partially overcomes the limits reported above with reference to the regulation devices of a known type.

In accordance with the present disclosure, an electronic regulation device of a variable capacitance of an integrated circuit having a time parameter dependent on the variable capacitance is provided, the device including a regulation loop configured to generate binary regulation signals for the variable capacitance; a block of switching capacitors in the regulation loop suitable to emulate the variable capacitance, the block comprising a first array of capacitors that can be activated and deactivated based on the binary regulation signals to be selectively connected in parallel therebetween, the first array including capacitors having respective binarily increasing capacitances from a first minimum capacitive value, the capacitor block further including at least one second array of switching capacitors that can be activated and deactivated based on the binary regulation signals to be selectively connected in parallel therebetween and to the capacitors of the first array, the at least second array at least partially including capacitors having binarily increasing capacitances starting from a second minimum capacitive value that is different from the first minimum capacitive value.

In accordance with another aspect of the present disclosure, a circuit is provided that includes a variable capacitance of an integrated circuit having a time parameter dependent on the variable capacitance; a control logic register structured to provide first and second control logic signals; and a block of first and second arrays of switching capacitors structured to receive the first and second control logic signals, respectively, the first and second capacitor arrays selectively activated by the first and second control logic signals to emulate the variable capacitance, each array of the first and second capacitor arrays comprising a plurality of switching capacitors having binarily increasing capacitances, with the first array starting at a first minimum capacitance and the second array starting at a second minimum capacitance that is higher than the first minimum capacitance.

BRIEF DESCRIPTION OF THE SEVERAL VIEWS OF THE DRAWINGS

Further characteristics and advantages of the above-mentioned regulation device of variable capacitances will be understood from the following description of a preferred implementation example, given by way of indicative, non-limiting example, with reference to the annexed Figures, in which.

DETAILED DESCRIPTION

Figure 1:
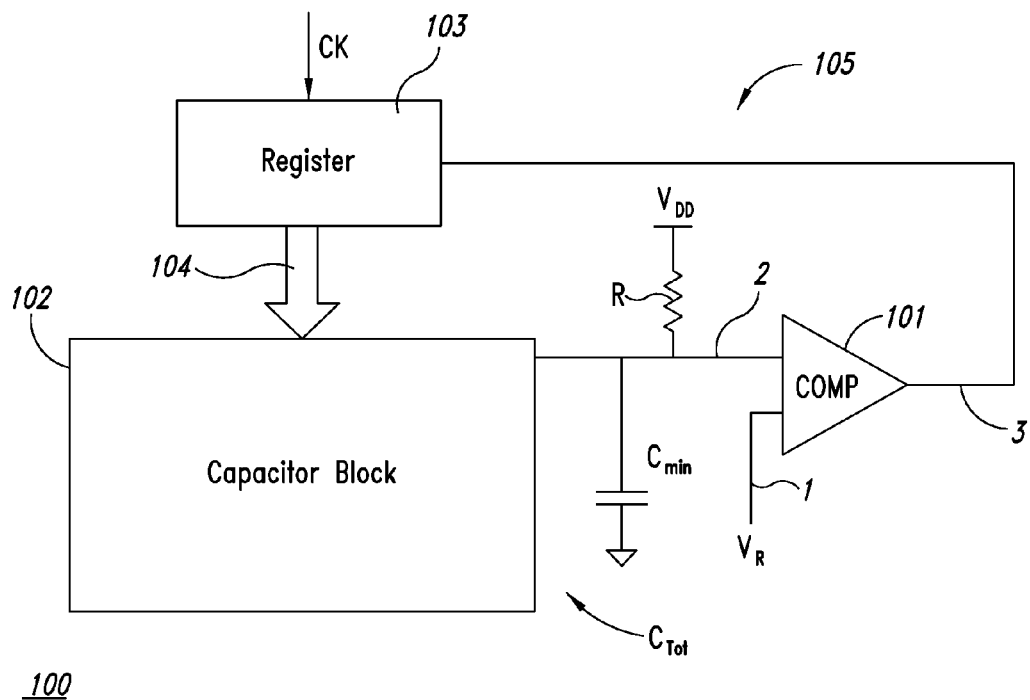
FIG. 1 exemplarily shows a structure of a regulation device of a variable capacitance of an integrated circuit having a block of capacitors that can be selected/deselected on the basis of binary logic signals.

With reference to the above-mentioned FIG. 1, an electronic device for regulating a variable capacitance of an integrated circuit is generally indicated with 100. Particularly, such regulation device 100 is so configured as to regulate the variable capacitance of capacitors of integrated circuits having a time parameter depending on such capacitance, such as, for example, the capacitors included in filters or ramp generators.

The regulation device 100 includes a regulation loop 105 having a comparator 101 (COMP) provided with a first input 1 connected to a reference voltage $V_R$ and with a second input 2 to which a capacitor Ctot with variable-capacitance is connected. Such variable capacitor $C_{tot}$ includes a reference capacitor $C_{min}$ connected in parallel to a block of capacitors 102 that can be selectively selected/deselected based on control binary logic signals. It shall be noticed that the variable capacitor $C_{tot}$ is analogous to the variable capacitor of the integrated filter or of the ramp generator, and it emulates the variable capacitance thereof.

Furthermore, in the case in which it is necessary to regulate a capacitance value of a capacitor in an integrated filter, the regulation device 100 of FIG. 1 includes a resistor R equal to the overall resistance associated with the filter, connected between the comparator 101 second input 2 and a known supply voltage VDD (see FIG. 1). Instead, in the case in which it is necessary to regulate a capacitance value of a capacitor in a ramp generator, a current generator will be connected between the second input 2 and the known supply voltage VDD.

An output 3 of the comparator 101 is connected to a register 103 with control logic that, on the basis of a signal generated by the comparator 101 and a clock signal CK is suitable to provide the above-mentioned control binary logic signals to the capacitor block 102 through a corresponding bus 104.

The feedback loop 105 of the regulation device 100 operates to bring the voltage level reached on the second input 2 from the $RC_{tot}$ product compared to the reference voltage $V_R$ at a time that is determined by the known clock CK.

It shall be noticed that the fedback regulation device 100 operates by trial and error, for example, by successive approximations, until merging to a regulated capacitance value $C_{tot}$, i.e., until determining an overall capacitance value Ctot that makes, for example, the value of the RC product of the integrated filter or the C/I ratio of the ramp generator proximate to the predetermined one, notwithstanding the process spreads. At the end of the regulation operation carried out by the device 100, the regulated capacitance value Ctot that is achieved is associated with a corresponding regulation sequence formed by the control logic signals that have determined it. Such regulation sequence is then made available to the variable capacitance of the integrated circuit.

Herein below, reference will be made to a four-bit regulation, therefore, four control or regulation binary signals will be made available on the bus 104, indicated by way of example with B0, B1, B2, and B3.

Figure 3:
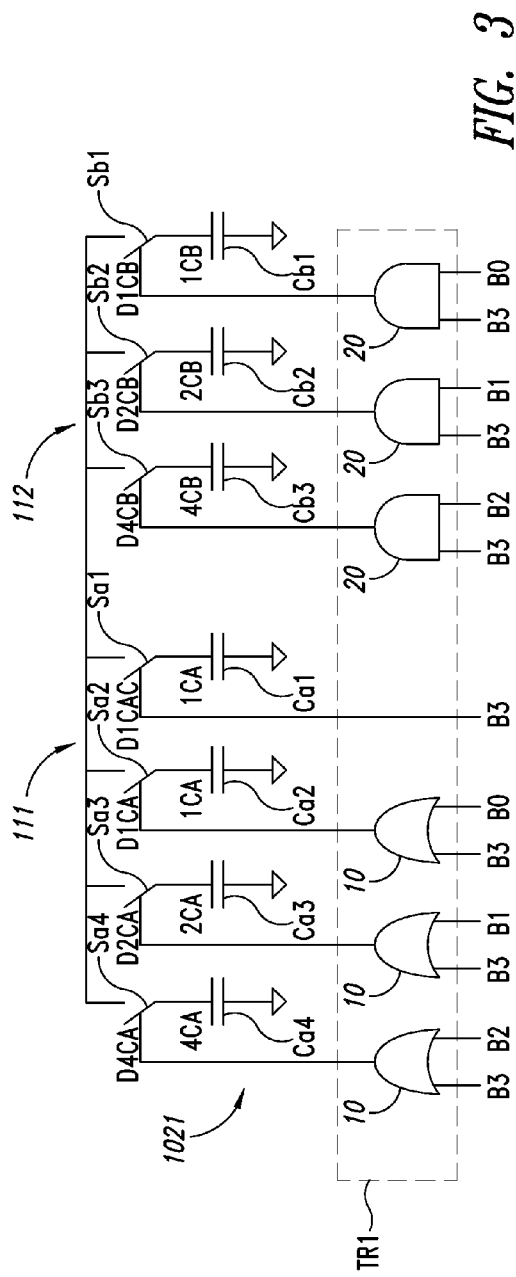
FIG. 3 exemplarily shows a first implementation example of the capacitor block of the device of FIG. 1 in accordance with the present disclosure.

A first implementation example of the capacitor block 102 in the regulation device 100 is shown in FIG. 3 and generally indicated with the reference 1021.

Such first block 1021 includes a first plurality or first array 111 of capacitors Ca1, Ca2, Ca3, Ca4 that can be selectively connected in parallel therebetween and to the reference capacitor Cmin. In more detail, such first array 111 includes a first capacitor Ca1 having a first minimum unit capacitance 1CA. The remaining capacitors Ca2, Ca3, Ca4 have respective binarily weighed capacitances (1CA, 2CA, 4CA) starting from the minimum unit capacitance 1CA.

Each capacitor Ca1, Ca2, Ca3, Ca4 of the first array 111 is selectively connectable in parallel to the reference capacitor Cmin or disconnectable from the latter after an activation/deactivation of a first plurality of switches Sa1-Sa4 that are controlled by respective first binary logic signals D1CAC, D1CA, D2CA, D4CA.

On the basis of the logical values (0 and logical 1) assumed by the above-mentioned first signals D1CAC, D1CA, D2CA, D4CA, the switches of the first plurality Sa1-a4 are activated and deactivated and, consequently, the number and the overall capacitance of the capacitors that are placed in parallel to the reference capacitor Cmin selectively vary.

Furthermore, the first block 1021 includes a second plurality or second array 112 of capacitors Cb1, Cb2, Cb3 selectively connectable in parallel therebetween, to the reference capacitor $C_{min}$, and to the capacitors of the first array 111. The second array 112 capacitors Cb1, Cb2, Cb3 have binarily weighed capacitances (1CB, 2CB, 4CB) starting from a respective second minimum unit capacitance 1CB.

Furthermore, each capacitor Cb1, Cb2, Cb3 of the above-mentioned second array 112 is selectively connectable in parallel to the reference capacitor $C_{min}$, or disconnectable from the latter following the activation/deactivation of a second plurality of switches Sb1-Sb3 that are controlled by respective second binary logic signals D1CB, D2CB, D4CB.

It shall be noticed that the first unitary minimum value 1CA of the first array 111 of capacitors is different from the second minimum unit value 1CB of the second array 112. Preferably, such second minimum unit value 1CB is higher than the first minimum unit value 1CA of the first array.

Furthermore, the above-mentioned first binary logic signals D1CAC, D1CA, D2CA, D4CA, and the second binary logic signals D1CB, D2CB, D4CB are generated by a transcoding block TR1 starting from a processing of the four control logic signals B0, B1, B2, B3 generated by the register 103. By way of example, with reference to FIG. 3, the transcoding block TR1 is implemented through three OR type logical ports 10 and through three AND type logical ports 20. Each of such ports is suitable to receive as inputs two of the control logic signals B0, B1, B2, and B3. Furthermore, the logic signal D1CAC corresponds to the control signal B3.

However, it shall be noticed that the transcoding block TR1 can be implemented also by circuit structures that are different from that of the example shown, which implement the same driving operations of the switches of the first Sa1-Sa4 and of the second Sb1-Sb3 pluralities.

Figure 2:
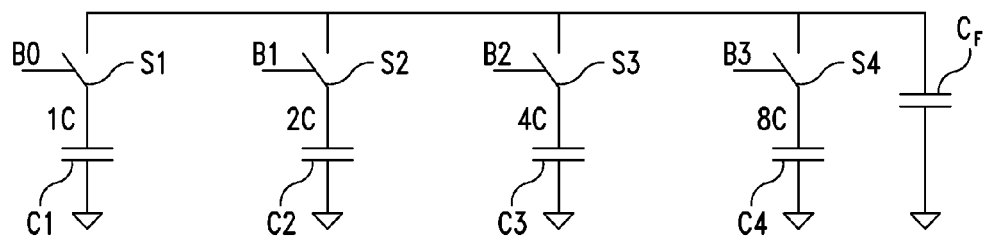
FIG. 2 exemplarily shows a modular structure of an integrated capacitor with variable capacitance of a known type.

It shall be further noticed that the sum of the capacitances of the capacitors of the first 111 and the second 112 arrays in the above-mentioned first block 1021 and of the reference capacitor $C_{min}$ is equal to the capacitance totally achieved by summing all the capacitors of the known structure shown in FIG. 2.

Advantageously, the first block 1021 is configured so that, during the regulation, the capacitive values of the capacitors Ca1, Ca2, Ca3, Ca4 of the first array 111 are activated first, i.e., are summed first to the reference capacitor $C_{min}$ for low values of a binary word with code B3B2B1B0 (with B3 the most significant bit, and B0 the less significant bit) composed of the control signals B0, B1, B2, B3 as it is inferred, by way of example, from table 1.

Particularly, table 1 shows, as a function of the 4 bit input code word B3B2B1B0, how the driving operations of the capacitors of the first block 1021 vary, i.e., the binary values assumed by the first logic signals D1CAC, D1CA, D2CA, D4CA and the second logic signals D1CB, D2CB, D4CB generated, during the regulation, by the transcoding block TR1.

It shall be noticed that, for low codes (for example, 0000 to 1000), the capacitors participating in the regulation trials and errors are those of the first array 111, i.e., Ca1, Ca2, Ca3, Ca4, and the capacitance totally summed to the reference capacitor Cmin linearly increases with increments that are equal to the first minimum unit value 1CA passing from a code word to the following one.

Starting from the code word 1001, and to the word 1111, the first array 111 capacitors Ca1, Ca2, Ca3, Ca4 remain all connected in parallel therebetween, and the second array 112 capacitors Cb1, Cb2, Cb3 start to be summed thereto. Particularly, in this case, the capacitance summed both to the reference capacitor Cmin and the first array 111 capacitors linearly increases with increments that are equal to the second minimum unit value 1CB passing from a code word to the following one. At word 1111, all the capacitors of the first 111 and second 112 arrays are enabled at a same time.

Advantageously, during the regulation, the second array 112 capacitors Cb1, Cb2, Cb3 are added to the first array 111 Ca1, Ca2, Ca3, Ca4 ones and are not substituted for them. This avoids the proposed solution generating discontinuities in the capacitive values.

Furthermore, advantageously, the transcoding block TR1 operates on the first capacitor block 1021 so as to activate the smallest capacitances (i.e., those of the first array 111), when, on the whole, the involved capacitances are few, then at a percentage variation higher than the regulation error, and, vice versa, to exploit the accuracy excess for code words in the range 1001-1111, implementing higher capacitances and then losing relative accuracy, so that the percentage error is comparable on the whole at both ends of the first block 1021.

Table 2 shows (at column 2), as a function of the variation of the 4-bit input code B3B2B1B0, how the accuracy of the regulation carried out by the first block 1021 varies compared to the accuracy values that can be achieved by the known solution of FIG. 2 (column 1). Furthermore, such table 2 indicates the optimized values of the first 1CA and the second 1CB unit capacitances associated with the first 111 and the second 112 arrays of capacitors, respectively.

For example, to correct a spread of about +/−50%, and assuming that the capacitance to be searched for is 1, the subdivision to implement in the block 1021 will be such that, if $C_{min}$=0.5, it has to be $C_{tot}$=1.5. Consequently, the capacitor block 102 assumes a value that is equal to 1.

TABLE 2

| BBBB 3210 | 1 | | 2 | | 3 | |
|---|---|---|---|---|---|---|
| 0000 | 12.5 | 1C = | 9.2 | 1CA = | 7.9 | 1CA = |
| 0001 | 11.1 | 0.0625 | 8.4 | 0.045753 | 7.3 | 0.039509 |
| 0010 | 10 | | 7.7 | | 6.8 | |
| 0011 | 9.1 | | 7.2 | | 6.4 | |

TABLE 1

| BBBB 3210 | D1CA | D2CA | D4CA | D1CAC | D1CB | D2CB | D4CB |
|---|---|---|---|---|---|---|---|
| 0000 | 0 | 0 | 0 | 0 | 0 | 0 | 0 |
| 0001 | 1 | 0 | 0 | 0 | 0 | 0 | 0 |
| 0010 | 0 | 1 | 0 | 0 | 0 | 0 | 0 |
| 0011 | 1 | 1 | 0 | 0 | 0 | 0 | 0 |
| 0100 | 0 | 0 | 1 | 0 | 0 | 0 | 0 |
| 0101 | 1 | 0 | 1 | 0 | 0 | 0 | 0 |
| 0110 | 0 | 1 | 1 | 0 | 0 | 0 | 0 |
| 0111 | 1 | 1 | 1 | 0 | 0 | 0 | 0 |
| 1000 | 1 | 1 | 1 | 1 | 0 | 0 | 0 |
| 1001 | 1 | 1 | 1 | 1 | 1 | 0 | 0 |
| 1010 | 1 | 1 | 1 | 1 | 0 | 1 | 0 |
| 1011 | 1 | 1 | 1 | 1 | 1 | 1 | 0 |
| 1100 | 1 | 1 | 1 | 1 | 0 | 0 | 1 |
| 1101 | 1 | 1 | 1 | 1 | 1 | 0 | 1 |
| 1110 | 1 | 1 | 1 | 1 | 0 | 1 | 1 |
| 1111 | 1 | 1 | 1 | 1 | 1 | 1 | 1 |

TABLE 2-continued

| BBBB 3210 |     | 1   |         | 2   |         | 3         |
| --------- | --- | --- | ------- | --- | ------- | --------- |
| 0100      | 8.3 |     |         | 6.7 |         | 7.9 1CB = |
| 0101      | 7.7 |     |         | 6.3 |         | 7.3 0.051997 |
| 0110      | 7.1 |     |         | 5.9 |         | 6.8       |
| 0111      | 6.7 |     |         | 5.6 |         | 6.4       |
| 1000      | 6.2 |     |         | 9.2 | 1CB =   | 7.9 1CC = |
| 1001      | 5.9 |     |         | 8.4 | 0.079247| 7.3 0.068432 |
| 1010      | 5.6 |     |         | 7.7 |         | 6.8       |
| 1011      | 5.3 |     |         | 7.2 |         | 6.4       |
| 1100      | 5   |     |         | 6.7 |         | 7.9 1CD = |
| 1101      | 4.8 |     |         | 6.3 |         | 7.3 0.090062 |
| 1110      | 4.5 |     |         | 5.9 |         | 6.8       |
| 1111      | 4.3 |     |         | 5.6 |         | 6.4       |

It shall be noticed that the optimal values of the unit capacitances 1CA and 1CB can be achieved by trial and error or, preferably, by solving an equation between the maximum errors generated at the first 111 and the second 112 array of capacitors (for the codes 0000 and 1000, respectively), bearing in mind that the maximum error associated with the first array 111 of capacitors is $Ca1/C_{min}$, while that associated with the second array 112 is $Cb1/(C_{min}+Ca1+Ca2+Ca3+Ca4)$.

By way of example, the numerical values of the above-mentioned minimum unit capacitances can be obtained by the following formula:

$$C_{b_{i-1}b_{i-2}\ldots b_3b_2b_1b_0} = \frac{A \cdot \left(-1 + \sqrt[2^i]{\left(1+\frac{B}{A}\right)}\right) \cdot \left(\prod_{p=0}^{i-1} (2^{(i-p)b_p}) \sqrt{\left(1+\frac{B}{A}\right)}\right)}{2^{(n-i)}} \quad (1)$$

in which:
  n is the number of bits;
  i indicates the maximum number of array subdivisions (the maximum value that it can assume is n);
  A corresponds to the reference capacitance Cmin;
  B corresponds to the total adjustable capacitance included in the block 102.

In formula (1), to differentiate the capacitances, a subscript has been added, which represents a binary number increasing as the selected capacitance increases. In fact, the formula gives a capacitance C with subscripts bi−1, bi−2 . . . b1, b0 that are the single digits of the described binary code mentioned above.

With reference to the first capacitor block 1021 of FIG. 3, if the total capacitance Ctot to be regulated is equal to 1, and the optimal values of unit capacitances are of about CA=0.0457 and CB=0.0793, the maximum adjustment percentage introduced by each plurality of capacitors 111 and 112 of the first block 1021 is 9.2%, while the minimum one is 5.6%. In such case, the maximum error that can be achieved with the known structure 200 is 12.5% (for a unit capacitance equal to about 0.0625), while keeping the total capacitance and covered variation spread constant. Therefore, the first capacitor block 1021 advantageously reduces such error, as the range between the maximum and the minimum error was also reduced.

It shall be further noticed that the overall nominal capacitance integrated in the first block 1021 is equal to that of the known structure of FIG. 2. The silicon area occupied by the additional logical circuitry is negligible, compared to the total area occupied by the capacitances, due to the modern miniaturizing processes of the electronic integrated circuits. Therefore, the most complex circuit structure of the first block 1021 does not substantially occupy much more chip area than the known solution of FIG. 2.

Figure 4:
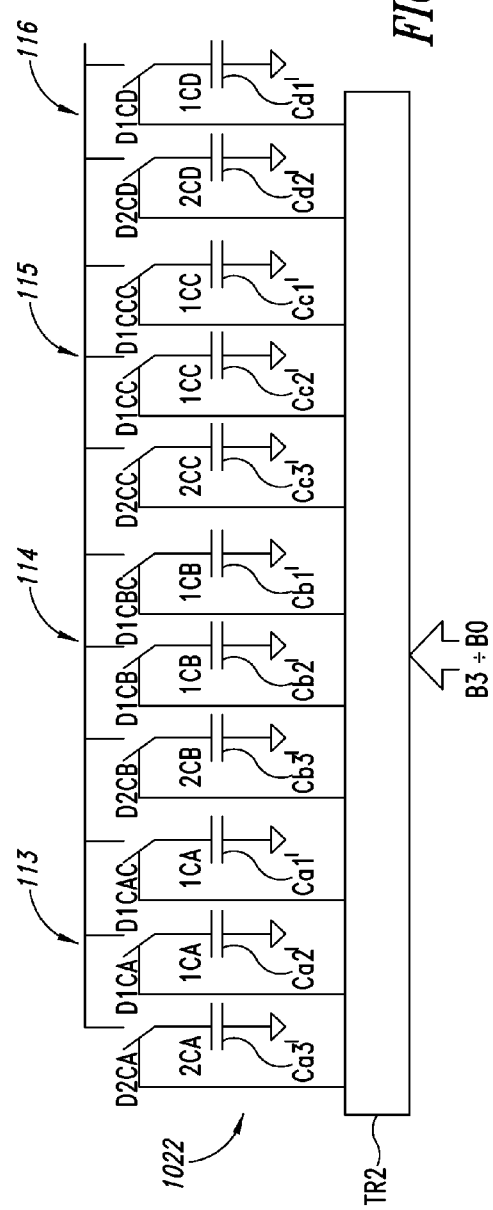
FIG. 4 exemplarily shows a second implementation example of the capacitor block in the device of FIG. 1 in accordance with the present disclosure.

Starting from the solution described with reference to FIG. 3, it is possible to further improve the final accuracy by providing the subdivision of each capacitors array of the first block 1021 in respective sub-arrays, as shown in FIG. 4.

In more detail, FIG. 4 shows a second implementation example of the capacitor block 102 included in the regulation device 100 of FIG. 1, and generally indicated with the reference 1022.

The second capacitor block 1022 includes a further first 113 (Ca1', Ca2', Ca3'), a further second 114 (Cb1', Cb2', Cb3'), a third 115 (Cc1', Cc2', Cc3'), and a fourth 116 (Cd1', Cd2') plurality (or array) of capacitors, respectively, that can be connected in parallel therebetween and to the reference capacitor $C_{min}$.

In more detail, such further first array 113 includes a further first capacitor Ca1' having a first minimum unit capacitance 1CA. The remaining capacitors Ca2' and Ca3' have respective binarily weighed capacitances starting from the minimum unit capacitance.

Similarly, such further second (third) array 114 (115) includes a further second (third) capacitor Cb1' (Cc1') having a second (third) minimum unit capacitance 1CB (1CC), and the remaining capacitors Cb2' and Cb3' (Cc2' and Cc3') have respective binarily weighed capacitances starting from the minimum unit capacitance.

Finally, the fourth capacitor array 116 has respective binarily weighed capacitances starting from a fourth minimum unit capacitance 1CD.

Furthermore, each capacitor of the above-mentioned further first 113, further second 114, third 115, and fourth 116 arrays is selectively connectable in parallel to the reference capacitor $C_{min}$, or disconnectable therefrom following an activation/deactivation of corresponding pluralities of switches. Such switches are controlled by binary logic signals D1CAC, D1CA, D2CA, D1CBC, D1CB, D2CB, D1CCC, D1CC, D2CC, and D1CD, D2CD.

Based on logical values (0 and logical 1) assumed by the above-mentioned binary signals D1CAC, D1CA, D2CA, D1CBC, D1CB, D2CB, D1CCC, D1CC, D2CC, and D1CD, D2CD, the switches are activated and de-activated and, consequently, the number and the capacitance of the capacitors that are placed in parallel to the reference capacitor $C_{min}$, vary.

With reference to the second capacitor block 1022, preferably, the minimum unit capacitive value 1CA associated with the above-mentioned further first array 113 is different from the minimum capacitive values 1CB, 1CC, 1CD of the further second array 114, the third array 115, and the fourth 116, respectively. Preferably, the minimum unit capacitive value 1CA of the above-mentioned further first array 113 is lower than the minimum capacitive value 1CB of the further second array 114 that, in turn, is lower than the minimum capacitive value 1CC of the third array 115. Furthermore, the third array 115 minimum unit capacitive value 1CC is lower than that 1CD of the fourth array 116. Furthermore, the above-mentioned binary logic signals D1CAC, D1CA, D2CA, D1CBC, D1CB, D2CB, D1CCC, D1CC, D2CC, and D1CD, D2CD are generated by a further transcoding block TR2 based on a processing of the four control logic signals B0, B1, B2, B3 generated by the register 103.

Particularly, it shall be noticed that such further transcoding block TR2 is configured to select the capacitors of the second block 1022 so that, as the code word B3B2B1B0 increases, for the capacitors of a same array, the added capacitance increases by an amount that is equal to the minimum unit capacitance relative to such array. Furthermore, passing from one capacitor array to the following one, it is always provided that the capacitances of the latter are added to (and not substituted for) the capacitances of the array previously involved in the regulation.

Table 3 shows, as a function of the 4-bit input code word B3B2B1B0, how the driving operations of the capacitors of the second block 1022 vary, i.e., which binary values are assumed by the logic signals D1CAC, D1CA, D2CA, D1CBC, D1CB, D2CB, D1CCC, D1CC, D2CC, and D1CD, D2CD generated by the further transcoding block TR2.

With reference to table 2 (column 3), by employing the second capacitor block 1022, CA will be equal to about 0.0395, CB=0.052, CC=0.0684, and CD=0.09. In such manner, a maximum error of 7.9% and a minimum error of 6.4% is achieved.

It shall be noticed that it is possible to subdivide the second capacitor block 1022 of FIG. 4 into further sub-arrays.

TABLE 3

| BBBB 3210 | D1CA | D2CA | D1CAC | D1CB | D2CB | D1CBC | D1CC | D2CC | D1CCC | D1CD | D2CD |
|---|---|---|---|---|---|---|---|---|---|---|---|
| 0000 | 0 | 0 | 0 | 0 | 0 | 0 | 0 | 0 | 0 | 0 | 0 |
| 0001 | 1 | 0 | 0 | 0 | 0 | 0 | 0 | 0 | 0 | 0 | 0 |
| 0010 | 0 | 1 | 0 | 0 | 0 | 0 | 0 | 0 | 0 | 0 | 0 |
| 0011 | 1 | 1 | 0 | 0 | 0 | 0 | 0 | 0 | 0 | 0 | 0 |
| 0100 | 1 | 1 | 1 | 0 | 0 | 0 | 0 | 0 | 0 | 0 | 0 |
| 0101 | 1 | 1 | 1 | 1 | 0 | 0 | 0 | 0 | 0 | 0 | 0 |
| 0110 | 1 | 1 | 1 | 0 | 1 | 0 | 0 | 0 | 0 | 0 | 0 |
| 0111 | 1 | 1 | 1 | 1 | 1 | 0 | 0 | 0 | 0 | 0 | 0 |
| 1000 | 1 | 1 | 1 | 1 | 1 | 1 | 0 | 0 | 0 | 0 | 0 |
| 1001 | 1 | 1 | 1 | 1 | 1 | 1 | 1 | 0 | 0 | 0 | 0 |
| 1010 | 1 | 1 | 1 | 1 | 1 | 1 | 0 | 1 | 0 | 0 | 0 |
| 1011 | 1 | 1 | 1 | 1 | 1 | 1 | 1 | 1 | 0 | 0 | 0 |
| 1100 | 1 | 1 | 1 | 1 | 1 | 1 | 1 | 1 | 1 | 0 | 0 |
| 1101 | 1 | 1 | 1 | 1 | 1 | 1 | 1 | 1 | 1 | 1 | 0 |
| 1110 | 1 | 1 | 1 | 1 | 1 | 1 | 1 | 1 | 1 | 0 | 1 |
| 1111 | 1 | 1 | 1 | 1 | 1 | 1 | 1 | 1 | 1 | 1 | 1 |

Particularly, table 4 shows, by way of example, as a function of the variation of the 4-bit input code B3B2B1B0, how the accuracy of the regulation carried out when the capacitor block 102 includes 8 different capacitor arrays (column 4) and 16 arrays (column 5), respectively, varies.

Table 4 indicates the values of the unit capacitances associated with each array. Also in these two implementation examples of the disclosure, it shall be noticed that, preferably, the minimum unit capacitive value associated with each array increases as the code word increases, i.e., passing from a capacitors array to the following one that is involved in the regulation.

TABLE 4

| BBBB 3210 | 4 | | 5 | |
|---|---|---|---|---|
| 0000 | 7.4 | 1CA = | 7.1 | 1CA = 0.035538 |
| 0001 | 6.8 | 0.036801 | 7.1 | 1CB = 0.038064 |
| 0010 | 7.4 | 1CB = | 7.1 | 1CC = 0.040769 |
| 0011 | 6.8 | 0.042218 | 7.1 | 1CD = 0.043667 |
| 0100 | 7.4 | 1CC = | 7.1 | 1CE = 0.04677 |
| 0101 | 6.8 | 0.048432 | 7.1 | 1CF = 0.050095 |
| 0110 | 7.4 | 1CD = | 7.1 | 1CG = 0.053655 |
| 0111 | 6.8 | 0.055562 | 7.1 | 1CH = 0.057469 |
| 1000 | 7.4 | 1CE = | 7.1 | 1CI = 0.061553 |
| 1001 | 6.8 | 0.063741 | 7.1 | 1CL = 0.065928 |
| 1010 | 7.4 | 1CF = | 7.1 | 1CM = 0.070614 |
| 1011 | 6.8 | 0.073123 | 7.1 | 1CN = 0.075633 |

TABLE 4-continued

| BBBB 3210 | 4 | | 5 | |
|---|---|---|---|---|
| 1100 | 7.4 | 1CG = | 7.1 | 1CO = 0.081009 |
| 1101 | 6.8 | 0.083887 | 7.1 | 1CP = 0.086766 |
| 1110 | 7.4 | 1CH = | 7.1 | 1CQ = 0.092933 |
| 1111 | 6.8 | 0.096236 | 7.1 | 1CR = 0.099538 |

In addition, for a capacitor block 102 subdivided into 8 capacitors arrays, a maximum error of 7.4%, and a minimum one at 6.8% are achieved. While, for a block subdivided into 16 arrays, the maximum error and the minimum one coincide, and are equal to 7.1%.

Although the described examples are a 4-bit regulation, the teachings of the present disclosure fully apply also to the case in which the number of bits employed in the regulation is different.

Advantageously, the regulation device having a capacitor block 102, implemented as in the examples described above, therefore ensures a regulation accuracy that is higher than that of the known solutions, while keeping the number of regulation bits employed constant, while keeping the total capacitance and process spread covered by the regulation constant.

To the embodiments of the regulation device described above, those of ordinary skill in the art, in order to meet contingent needs, will be able to make modifications, adjustments, and replacements of elements with functionally equivalent other ones, without departing from the scope of the following claims. Each of the characteristics described as belonging to a possible embodiment can be implemented independently from the other embodiments described.

The various embodiments described above can be combined to provide further embodiments. All of the U.S. patents, U.S. patent application publications, U.S. patent application, foreign patents, foreign patent application and non-patent publications referred to in this specification and/or listed in the Application Data Sheet are incorporated herein by reference, in their entirety. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic regulation device, comprising:
a regulation loop configured to generate binary regulation signals for a variable capacitance, the regulation loop including;
a block of capacitors configured to emulate the variable capacitance, the block of capacitors including:
a first array of capacitors configured to be selectively coupled in parallel and to be activated and deactivated by the binary regulation signals, the first array of capacitors including capacitors having respective binarily increasing capacitances from a first minimum capacitive value; and
at least one second array of capacitors configured to be selectively coupled in parallel and to be activated and deactivated by the binary regulation signals, the at least one second array of capacitors at least partially including capacitors having binarily increasing capacitances starting from a second minimum capacitive value that is different from the first minimum capacitive value, the at least one second array of capacitors being configured to selectively activate capacitors of the at least one second array only when all of the capacitors of the first array of capacitors are activated.

2. The electronic regulation device of claim 1, wherein the first minimum capacitive value is higher than the second minimum capacitive value.

3. The electronic regulation device of claim 1, wherein the regulation loop includes:
a first plurality of switches configured to be controlled by first binary logic signals and to activate and deactivate the capacitors of the first array, respectively, and
a second plurality of switches configured to be controlled by second binary logic signals and to activate and deactivate the capacitors of the at least one second array, respectively.

4. The electronic regulation device of claim 3, further including a transcoding block configured to generate the first and second control logic signals based on a processing of the binary regulation signals.

5. The electronic regulation device of claim 1, wherein the at least one second array comprises two capacitors having capacitances equal to the second minimum capacitance value.

6. The electronic regulation device of claim 1, wherein the capacitor block comprises on the whole 2, 4, 8, or 16 distinct arrays of capacitors.

7. The electronic regulation device of claim 4, wherein the transcoding block is configured to sum the binarily increasing capacitances of the capacitors of the first array to an overall capacitance given by the capacitors of the at least one second array.

8. The electronic regulation device of claim 4, wherein the transcoding block is configured to selectively activate and deactivate the capacitors of the at least one second array for low values of a regulation code word by linearly increasing an overall capacitance given by the block of capacitors by an amount that is equal to the second minimum capacitance value.

9. The electronic regulation device of claim 8, wherein the transcoding block is configured to maintain all the capacitors of the at least one second array always active, and to activate and deactivate the capacitors of the first array by linearly increasing an overall capacitance given by the second array by an amount that is equal to the first minimum capacitance value.

10. The electronic regulation device of claim 1, wherein the regulation loop comprises:
a comparator having a first input configured to receive a reference voltage, a second input to which the capacitor block is electrically coupled, and an output; and
a control logic register electrically coupled to an output of the comparator and configured to provide the binary regulation logic signals to the capacitor block based on a clock signal.

11. The electronic regulation device of claim 1, wherein the minimum capacitive values of the first array and the at least one second array can be achieved using the equation:

$$C_{b_{i-1}b_{i-2}...b_3b_2b_1b_0} = \frac{A \cdot \left(-1 + 2^i\sqrt{\left(1+\frac{B}{A}\right)}\right) \cdot \left(\prod_{p=0}^{i-1} \left(2^{(i-p)b_p}\right)\sqrt{\left(1+\frac{B}{A}\right)}\right)}{2^{(n-i)}}$$

in which:
n is a number of bits;
i indicates a maximum number of array subdivisions;
A is a reference capacitance;
B is a total adjustable capacitance comprised in the capacitor block.

12. A circuit, comprising:
a variable capacitance of an integrated circuit having a time parameter dependent on the variable capacitance;
a control logic register structured to provide first and second control logic signals; and
a block of first and second arrays of switching capacitors structured to receive the first and second control logic signals, respectively, the first and second capacitor arrays being configured to be selectively activated by the first and second control logic signals to emulate the variable capacitance, each array of the first and second capacitor arrays including a plurality of switching capacitors having binarily increasing capacitances, with the first array starting at a first minimum capacitance and the second array starting at a second minimum capacitance that is different than the first minimum capacitance, the switching capacitors of the first array being configured to activate only when all of the switching capacitors of the second array are activated.

13. The circuit of claim 12, wherein the control logic register includes a transcoding block configured to generate the first and second control logic signals, the transcoding block configured to sum the binarily increasing capacitances of the switching capacitors of the first array to an overall capacitance given by the switching capacitors of the second array.

14. The circuit of claim 13, wherein the transcoding block is configured to selectively activate and deactivate the switching capacitors of the second array for low values of a regulation code word received at the transcoding block by linearly increasing the overall capacitance of an output of the block of first and second arrays of switching capacitors by an amount that is equal to the second minimum capacitance.

15. The circuit of claim 14, wherein the transcoding block is configured to maintain all the capacitors of the second array in an active condition and to activate and deactivate the switching capacitors of the first array by linearly increasing the overall capacitance given by the second array by an amount that is equal to the first minimum capacitance.

16. The circuit of claim 12, comprising:
a comparator provided with a first input configured to be electrically coupled to a reference voltage, a second input to which the capacitor block is electrically coupled, and an output electrically coupled to an input of the control logic register.

17. The circuit of claim 12, wherein the first minimum capacitance and the second minimum capacitance are determined using the equation:

$$C_{b_{i-1}b_{i-2}...b_3b_2b_1b_0} = \frac{A \cdot \left(-1 + 2^i\sqrt{\left(1 + \frac{B}{A}\right)}\right) \cdot \left(\prod_{p=0}^{i-1} {}^{(2^{(i-p)b_p})}\sqrt{\left(1 + \frac{B}{A}\right)}\right)}{2^{(n-i)}}$$

in which:
n is a number of bits;
i indicates a maximum number of array subdivisions;
A is a reference capacitance;
B is a total adjustable capacitance comprised in the capacitor block.

18. An electronic regulation device, comprising:
a regulation loop configured to generate binary regulation signals for a variable capacitance, the regulation loop including;
a block of capacitors configured to emulate the variable capacitance, the block of capacitors including:
a first array of capacitors configured to be selectively coupled in parallel and to be activated and deactivated by the binary regulation signals, the first array of capacitors including capacitors having respective binarily increasing capacitances from a first minimum capacitive value; and
at least one second array of capacitors configured to be selectively coupled in parallel and to be activated and deactivated by the binary regulation signals, the at least one second array of capacitors at least partially including capacitors having binarily increasing capacitances starting from a second minimum capacitive value that is different from the first minimum capacitive value, wherein the minimum capacitive values of the first array and the at least one second array are based on a maximum number of array sub-divisions, a number of bits, a reference capacitance and a total adjustable capacitance of the capacitive block.

19. The electronic regulation device of claim 18 wherein the minimum capacitive values of the first array and the at least one second array can be achieved using the equation:

$$C_{b_{i-1}b_{i-2}...b_3b_2b_1b_0} = \frac{A \cdot \left(-1 + 2^i\sqrt{\left(1 + \frac{B}{A}\right)}\right) \cdot \left(\prod_{p=0}^{i-1} {}^{(2^{(i-p)b_p})}\sqrt{\left(1 + \frac{B}{A}\right)}\right)}{2^{(n-i)}}$$

in which:
n is the number of bits;
i indicates the maximum number of array subdivisions;
A is the reference capacitance;
B is the total adjustable capacitance comprised in the capacitor block.

20. A circuit, comprising:
a variable capacitance of an integrated circuit having a time parameter dependent on the variable capacitance;
a control logic register structured to provide first and second control logic signals; and
a block of first and second arrays of switching capacitors structured to receive the first and second control logic signals, respectively, the first and second capacitor arrays being configured to be selectively activated by the first and second control logic signals to emulate the variable capacitance, each array of the first and second capacitor arrays including a plurality of switching capacitors having binarily increasing capacitances, with the first array starting at a first minimum capacitance and the second array starting at a second minimum capacitance that is higher than the first minimum capacitance, wherein the first minimum capacitance and the second minimum capacitance are based on a maximum number of array sub-divisions, a number of bits, a reference capacitance and a total adjustable capacitance of the capacitive block.

21. The circuit of claim 20 wherein the first minimum capacitance and the second minimum capacitance are determined using the equation:

$$C_{b_{i-1}b_{i-2}...b_3b_2b_1b_0} = \frac{A \cdot \left(-1 + 2^i\sqrt{\left(1 + \frac{B}{A}\right)}\right) \cdot \left(\prod_{p=0}^{i-1} {}^{(2^{(i-p)b_p})}\sqrt{\left(1 + \frac{B}{A}\right)}\right)}{2^{(n-i)}}$$

in which:
n is the number of bits;
i indicates the maximum number of array subdivisions;
A is the reference capacitance;
B is the total adjustable capacitance comprised in the capacitor block.

* * * * *